(12) United States Patent
Li

(10) Patent No.: US 8,542,020 B2
(45) Date of Patent: Sep. 24, 2013

(54) ELECTRONIC DEVICE AND APPARATUS FOR IDENTIFYING ELECTRONIC PRODUCT

(75) Inventor: Chunshu Li, Shenzhen (CN)

(73) Assignee: Huawei Device Co., Ltd., Shenzhen (CN)

( * ) Notice: Subject to any disclaimer, the term of this patent is extended or adjusted under 35 U.S.C. 154(b) by 340 days.

(21) Appl. No.: 12/948,895

(22) Filed: Nov. 18, 2010

(65) Prior Publication Data

US 2011/0115475 A1 May 19, 2011

(30) Foreign Application Priority Data

Nov. 18, 2009 (CN) .................... 2009 2 0179880 U

(51) Int. Cl.
*G01N 27/42* (2006.01)

(52) U.S. Cl.
USPC ....................................... 324/425; 324/76.11

(58) Field of Classification Search
None
See application file for complete search history.

(56) References Cited

U.S. PATENT DOCUMENTS

| 6,549,022 | B1 * | 4/2003 | Cole et al. ................ 324/754.23 |
| 7,958,286 | B2 * | 6/2011 | Bresemann et al. ............ 710/62 |
| 2007/0090982 | A1 | 4/2007 | Sing et al. | |
| 2007/0244934 | A1 | 10/2007 | Pan et al. | |

FOREIGN PATENT DOCUMENTS

| EP | 1 608 070 A2 | 12/2005 |
| WO | 03/100984 | 12/2003 |

OTHER PUBLICATIONS

European Search Report dated Mar. 23, 2011 in corresponding European Patent Application 10191633.6.

* cited by examiner

*Primary Examiner* — Jermele M Hollington
*Assistant Examiner* — Trung Nguyen
(74) *Attorney, Agent, or Firm* — Staas & Halsey LLP

(57) ABSTRACT

An apparatus for identifying an electronic product and an electronic device are disclosed. The apparatus includes: a detection voltage outputting unit, configured to receive a reference voltage and output a detection voltage; a detection voltage obtaining unit, connected to the detection voltage outputting unit and configured to obtain the value of the detection voltage; a mapping storing unit, configured to store a mapping between the value of the detection voltage and a product identifier; and a product identifier obtaining unit, configured to obtain the product identifier corresponding to the value of the detection voltage from the mapping storing unit according to the value of the detection voltage obtained by the detection voltage obtaining unit. With the apparatus for identifying an electronic product, the number of occupied chip detection ports is reduced, and the use area of a printed circuit board (PCB) is reduced.

16 Claims, 4 Drawing Sheets

ELECTRONIC DEVICE AND APPARATUS FOR IDENTIFYING ELECTRONIC PRODUCT

CROSS-REFERENCE TO RELATED APPLICATION

This application claims priority to Chinese Patent Application No. 200920179880.8, filed on Nov. 18, 2009, which is hereby incorporated by reference in its entirety.

FIELD OF THE INVENTION

The present invention relates to an electronic product technology, and in particular, to an electronic device and an apparatus for identifying an electronic product.

BACKGROUND OF THE INVENTION

With the development of electronic product technologies, the hardware versions of a series of electronic products developed on the same platform may be modified several times. To differentiate hardware versions, an identifier needs to be set for each product.

In the prior art, the product identifier is usually a resilient circuit, and the hardware versions of products are identified based on the resilient circuit. The resilient circuit may be multiple pull-up/pull-down resistors or Dual In-line Package (DIP) switches. The detection pins of the product chip are used to read the binary codes represented by the pull-up/pull-down resistors or the DIP switches so as to identify a hardware version of a product. For the pull-up/pull-down resistors, each detection pin of the product chip connects to two resistors, and the two resistors are connected to the ground and power supply respectively. With the selection of soldering the detection pin to different resistors, the electric potential of each detection pin is pulled up or pulled down to represent 1 and 0 in binary notation. The combination of multiple detection pins may provide a group of binary codes that represent the hardware version of a product. For the DIP switch, the switch creates a group of binary codes to represent the hardware version of the product. The detection pins of the chip obtains hardware version of the product by detecting the binary codes.

During the implementation of the present invention, the inventor finds the following technical problems in the prior art regardless of whether the pull-up/pull-down resistors or the DIP switches are used to identify the hardware versions of the products:

1. Multiple detection ports on the chip are used, and a lot of hardware resources are occupied.
2. A large printed circuit board (PCB) space is occupied, which enlarges the size of the device.
3. The costs are high, and the cabling is complex.

SUMMARY OF THE INVENTION

To solve the problems in the prior art, embodiments of the present invention provide an electronic device and an apparatus for identifying an electronic product.

An embodiment of a present invention in the present invention provides an apparatus for identifying an electronic product, including: a detection voltage outputting unit, configured to receive a reference voltage and output a detection voltage; a detection voltage obtaining unit, connected to the detection voltage outputting unit and configured to obtain a value of the detection voltage; a mapping storing unit, configured to store a mapping between the value of the detection voltage and a product identifier; and a product identifier obtaining unit, connected to the detection voltage obtaining unit and the mapping storing unit and configured to obtain the product identifier corresponding to the value of the detection voltage from the mapping storing unit according to the value of the detection voltage obtained by the detection voltage obtaining unit.

An embodiment of the present invention in the present invention provides an electronic device, including a functional module and an apparatus for identifying an electronic product. The apparatus for identifying an electronic product is configured to generate an electronic product identifier for the electronic device. The functional module is configured to implement various functions of the electronic device.

By using the apparatus for identifying an electronic product and the electronic device provided in embodiments of the present invention, a voltage-dividing circuit is used to convert a reference voltage of the electronic device into a detection voltage; the Analog-Digital Converting (ADC) module inhering in the electronic device is used to process the detection voltage to obtain the product identifier of the electronic product; the product identifier of the electronic product is directly output through a hardware port. In this way, the number of occupied chip detection ports is reduced, and the occupied area of the PCB is reduced. Therefore, size of the product is decreased, the number of resistors is saved, the design costs are reduced, and the cable layout is facilitated.

BRIEF DESCRIPTION OF THE DRAWINGS

The accompanying drawings are intended to facilitate the understanding of the present invention and constitute part of this application rather than limitation of the present invention. In the accompanying drawings.

DETAILED DESCRIPTION OF THE EMBODIMENTS

For better understanding of the objective, technical solution, and merits of the present invention, the present invention is hereinafter described in detail with reference to the accompanying drawings and exemplary embodiments. The exemplary embodiments of the present invention and related descriptions are intended to explain the present invention only, and do not limit the present invention.

Embodiment 1

Figure 1:
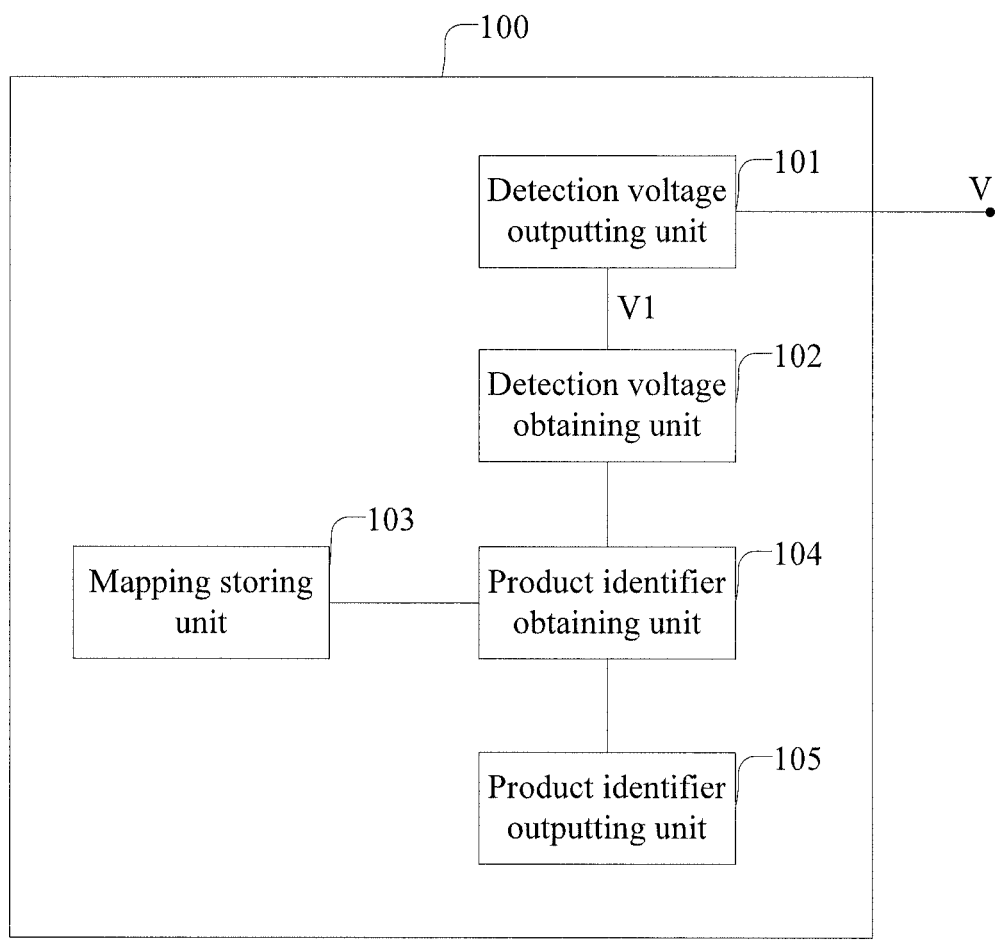
FIG. 1 is a block diagram of an apparatus for identifying an electronic product in an embodiment of the present invention.

FIG. 1 is a block diagram of an apparatus for identifying an electronic product in an embodiment of the present invention. As shown in FIG. 1, the apparatus 100 for identifying an electronic product includes a detection voltage outputting unit 101, a detection voltage obtaining unit 102, a mapping storing unit 103, and a product identifier obtaining unit 104.

The detection voltage outputting unit 101 is configured to receive a reference voltage and output a detection voltage.

In this embodiment of the present invention, the detection voltage outputting unit 101 is connected to the reference voltage output end and configured to receive a reference voltage V and output a detection voltage V' according to the reference voltage V. The detection voltage outputting unit 101 may be a voltage-dividing circuit. For example, the detection voltage outputting unit 101 may include a first resistor R3 and a second resistor R4. One end of R3 is connected to the reference voltage output end to receive the reference voltage V; the other end of R3 is connected to one end of R4 and the detection voltage obtaining unit 102. The other end of R4 is connected to the ground.

In this embodiment, the reference voltage V may be directly provided by the power supply of the electronic product or provided by the programmable port of the main chip on the electronic product. The relation between the detection voltage V' and the reference voltage V is represented by a voltage-dividing formula as follows:

$$V'=V*R4/(R3+R4)$$

The detection voltage obtaining unit 102 is connected to the detection voltage outputting unit 101 and configured to obtain the value of the detection voltage.

In this embodiment of the present invention, the detection voltage obtaining unit 102 is connected to the detection voltage outputting unit 101 and configured to: receive the detection voltage output by the detection voltage outputting unit 101, and generate the value of the detection voltage V' according to the received detection voltage.

In this embodiment of the present invention, the detection voltage obtaining unit 102 may be an ADC module. The ADC module may be located on the main chip of the electronic product. The application of the ADC technology is mature, with high precision. A lot of chips in the product have internal precision ADC circuits, most of which are idle to be used.

The mapping storing unit 103 is configured to store a mapping between the value of the detection voltage and the product identifier.

In this embodiment of the present invention, the range of the detection voltage may be calculated according to the reference voltage V, the detection precision of the detection voltage obtaining unit 102, and the precision of the detection voltage V' output by the detection voltage outputting unit 101. From 0, the detection voltage V1 of the first combination of R3 and R4 is calculated, and V1 may range from $V1_{min}$ to $V1_{max}$; after a certain interval S, the detection voltage V2 of the next combination is calculated, and V2 may range from $V2_{min}$ to $V2_{max}$ is obtained; and similarly, the detection voltage Vn of the $n^{th}$ combination can be calculated and Vn may range from $V_{nmin}$ to $V_{nmax}$.

Generally, the resistance precision of the resistors ranges from 1% to 5%. If the resistance precision is defined as a % and then taken into account, the following formula may be obtained according to the voltage-dividing formula $V'=V*R4/(R3+R4)$:

$$Vn=V*R4/(R3+R4), \text{ n being the product identifier;}$$

$$Vn_{min}=V*R4(1-a\%)/(R3+R4)(1+a\%);$$

$$Vn_{max}=V*R4(1+a\%)/(R3+R4)(1-a\%).$$

Figure 3:
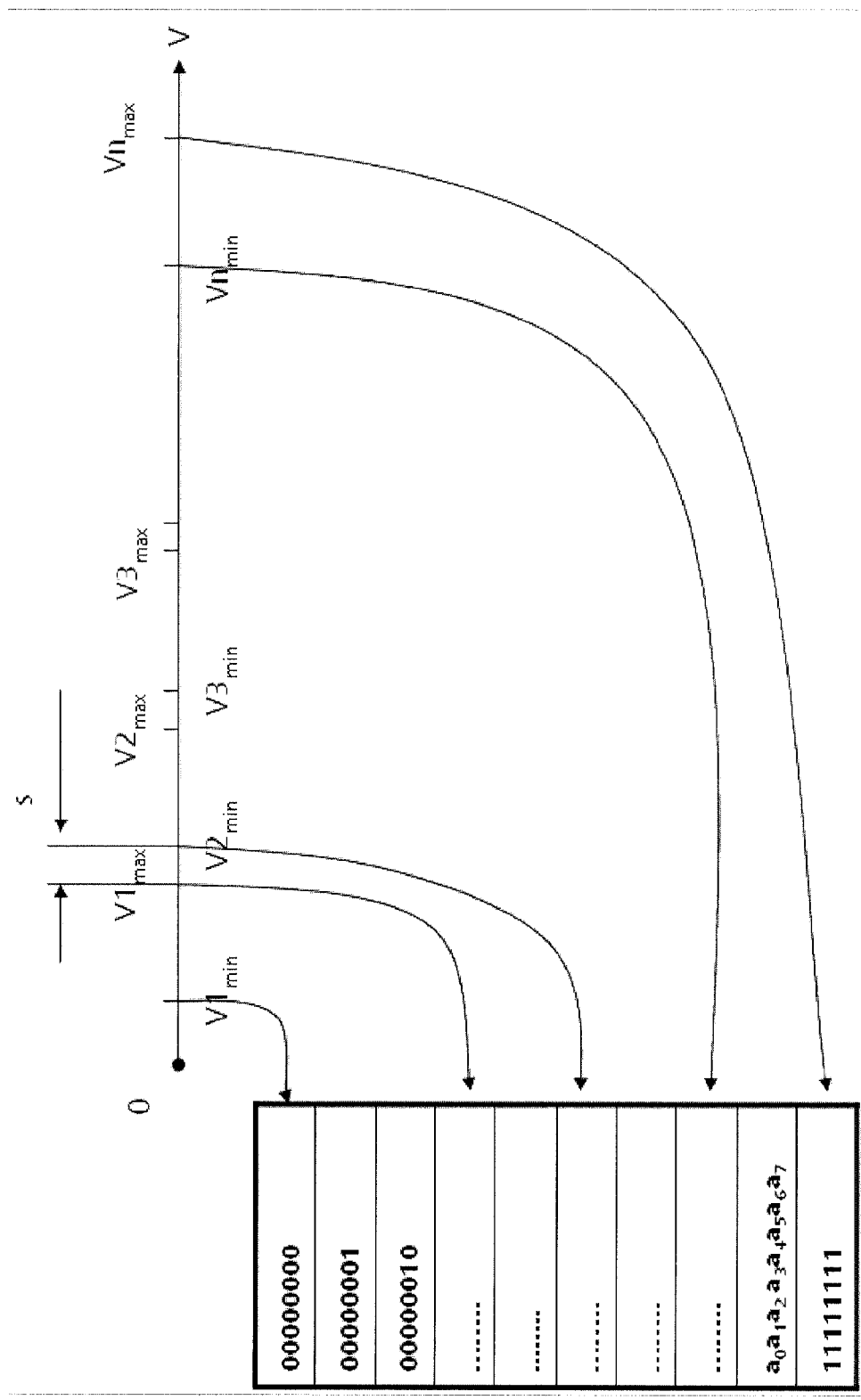
FIG. 3 is a schematic diagram illustrating a mapping between different voltage values and binary codes in an embodiment of the present invention.

This embodiment is based on the following values: R3=10 k; R4=100 k; resistance precision is 1%; the precision of the ADC is of 256 levels. According to these values, the following results may be obtained: Vn=0.90909090*V; $Vn_{min}$=0.89108911*V; $Vn_{max}$=0.92745638*V; and the voltage of each level is: V/256=0.00390625*V. Thus, the corresponding binary codes may be obtained. The certain interval S refers to the reserved error interval and may be selected according to the actual condition. In this embodiment, a two-digit precision interval is selected. Table 1 and FIG. 3 show the details. Table 1 lists the mappings between different voltage ranges and the product identifiers in this embodiment. FIG. 3 illustrates the mappings between different voltage values and binary codes in this embodiment of the present invention.

TABLE 1

| SN | Binary Code | Voltage Value | Symbol |
|---|---|---|---|
| 0 | 00000000 | 0* V | V0 |
| 1 | 00000001 | 0.000390625* V | |
| ... | ... | ... | ... |
| 226 | 11100010 | ... | $Vn_{min}-s$ |
| 227 | 11100011 | ... | ... |
| 228 | 11100100 | 0.89108911* V | $Vn_{min}$ |
| ... | ... | ... | ... |
| 232 | 11101000 | 0.90909090* V | Vn |
| ... | ... | ... | ... |
| 237 | 11101101 | 0.92745638* V | $Vn_{max}$ |
| 238 | 11101110 | ... | ... |
| 239 | 11101111 | ... | $Vn_{max}+s$ |
| ... | ... | ... | ... |

The product identifier obtaining unit 104 is connected to the detection voltage obtaining unit and the mapping storing unit, and configured to obtain a product identifier corresponding to the value of the detection voltage obtained by the detection voltage obtaining unit 102 from the mapping storing unit 103.

In this embodiment, the product identifier obtaining unit 104 finds a product identifier corresponding to the value of the detection voltage V' in the mapping storing unit 103.

In this embodiment, the apparatus 100 for identifying an electronic product may further include a product identifier outputting unit 105, which is connected to the product identifier obtaining unit 104 and configured to output the obtained product identifier.

By using the apparatus for identifying an electronic product and the electronic device provided in the first embodiment of the present invention, a voltage-dividing circuit is used to convert a reference voltage of the electronic device into a detection voltage; only the original detection voltage obtaining unit module inhering in the electronic device is used to process the detection voltage to obtain the product identifier of the electronic product; the identifier of the electronic product is directly output through a hardware port. In this way, the number of occupied chip detection ports is reduced, and the occupied area of the PCB is reduced. Therefore, size of the product is decreased, the number of resistors is saved, the design costs are reduced, and the cable layout is facilitated.

Embodiment 2

Figure 2:
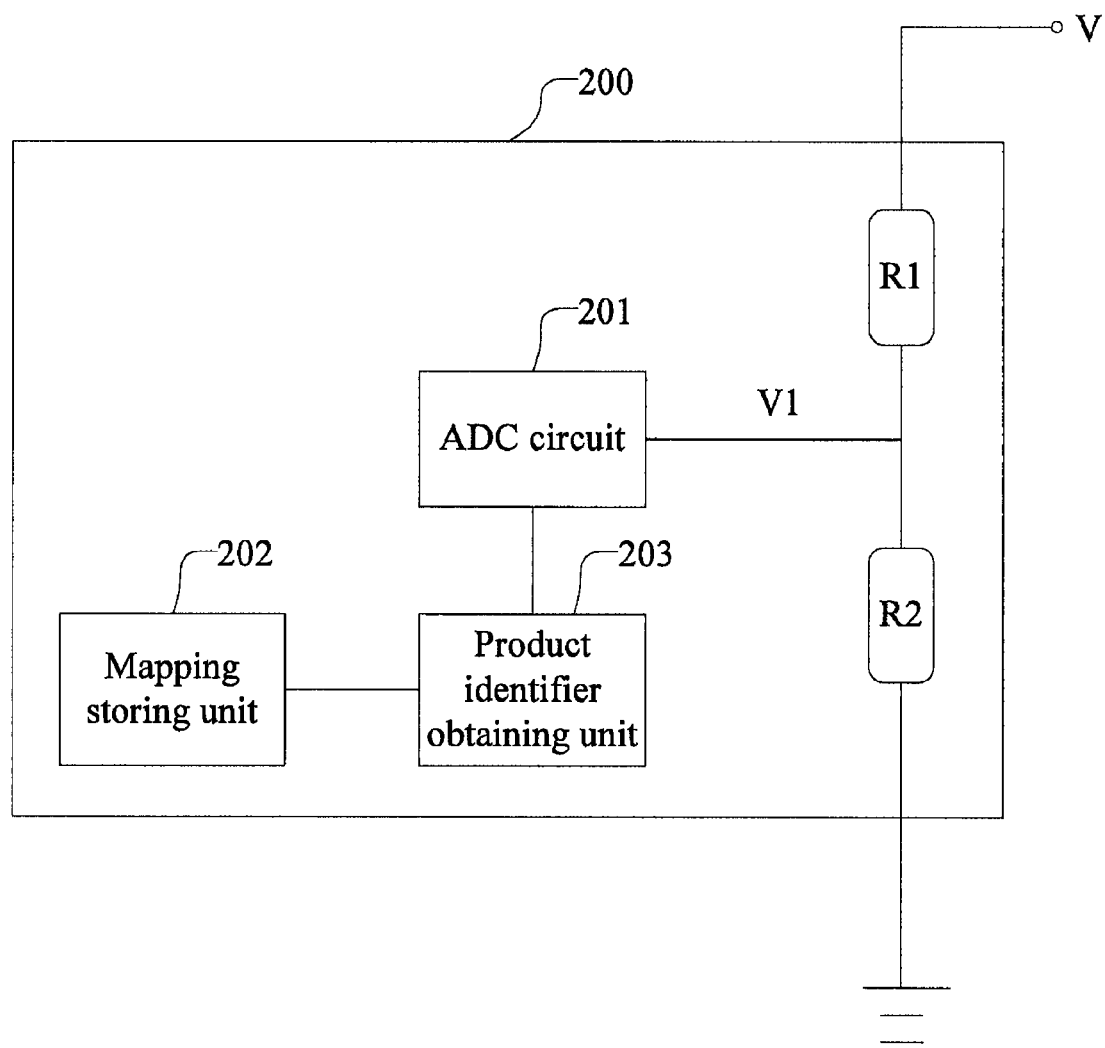
FIG. 2 is a block diagram of an apparatus for identifying an electronic product in an embodiment of the present invention.

FIG. 2 is a block diagram of an apparatus for identifying an electronic product in an embodiment of the present invention. As shown in FIG. 2, the apparatus 200 for identifying an electronic product includes a first resistor R1, a second resistor R2, an ADC circuit 201, a mapping storing unit 202, and a product identifier obtaining unit 203.

One end of the first resistor R1 is connected to the reference voltage output end and configured to receive the reference voltage V.

One end of the second resistor R2 is connected to the other end of the R1, and the other end of the R2 is grounded.

The ADC circuit 201 is connected to the one end of R1 and configured to receive a detection voltage and output the value of the detection voltage V'.

In this embodiment, the ADC circuit 201 may be included in the main chip of the product or be an independent entity outside the main chip. In this embodiment, the reference voltage V may be directly provided by the power supply of the electronic product or provided by the programmable port of the main chip of the electronic product. The relation between the detection voltage V' and the reference voltage V is represented by the following formula:

$$V'=V*R2/(R1+R2).$$

The mapping storing unit 202 is configured to store a mapping between the detection voltage V' and the product identifier. In this embodiment, the mappings of different product identifiers and different detection voltages V' may be preset.

The product identifier obtaining unit 203 is connected to the ADC circuit 201 and the mapping storing unit 202, and configured to obtain a product identifier corresponding to the detection voltage V' obtained by the ADC circuit 201 from the mapping storing unit 202.

By using the apparatus for identifying an electronic product and the electronic device provided in the second embodiment of the present invention, a voltage-dividing circuit is used to convert a reference voltage of the electronic device into a detection voltage; only the original ADC module inhering in the electronic device is used to process the detection voltage to obtain the product identifier of the electronic product; the identifier of the electronic product is directly output through a hardware port. In this way, the number of occupied chip detection ports is reduced, and the occupied area of the PCB is reduced. Therefore, size of the product is decreased, the number of resistors is saved, the design costs are reduced, and the cable layout is facilitated.

Embodiment 3

Figure 4:
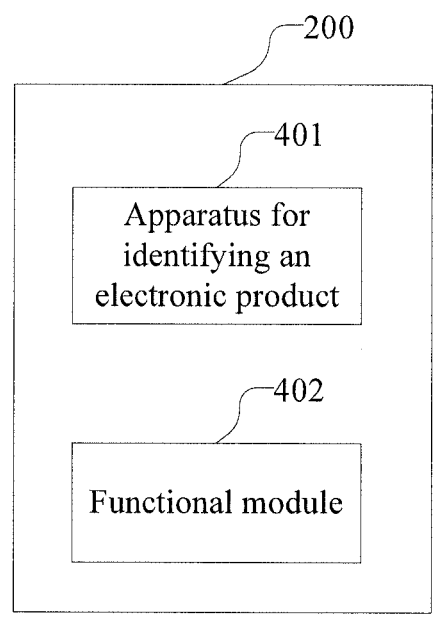
FIG. 4 is a block diagram of an electronic device in an embodiment of the present invention.

FIG. 4 is a block diagram of an electronic device in an embodiment of the present invention. As shown in FIG. 4, the electronic device 400 includes an apparatus 401 for identifying an electronic product, and a functional module 402.

The apparatus 401 for identifying an electronic product is configured to generate an electronic product identifier for the electronic device 400.

In this embodiment, the apparatus 401 may be the apparatus 100 provided in the first embodiment or apparatus 200 of the second embodiment. Thus, the structure and functions of the apparatus 401 are not further described.

The functional module 402 is configured to implement various functions of the electronic device 400.

In this embodiment, the electronic device 400 may include any existing electronic product with an ADC unit, such as an electronic device with communication functions (including a mobile terminal, a router, and a switch), a memory, or a displaying device. Accordingly, the functional module 402 may include but is not limited to the antenna module, data processing module, controlling module, displaying module, and storing module.

The preceding embodiments describe the objective, technical solution, and benefits of the present invention in detail. It is understandable that these embodiments are some exemplary embodiments and are not intended to limit the protection scope of the present invention. It is apparent that those skilled in the art can make various modifications and variations thereto without departing from the spirit and scope of the present invention. The present invention shall cover the modifications and variations provided that they fall within the protection scope of the present invention.

What is claimed is:

1. An apparatus for identifying an electronic product, comprising:
   a detection voltage outputting unit, configured to receive a reference voltage and output a detection voltage;
   a detection voltage obtaining unit, connected to the detection voltage outputting unit and configured to obtain the value of the detection voltage;
   a mapping storing unit, configured to store a mapping between the value of the detection voltage and a product identifier; and
   a product identifier obtaining unit, connected to the detection voltage obtaining unit and the mapping storing unit and configured to obtain the product identifier corresponding to the value of the detection voltage from the mapping storing unit according to the value of the detection voltage obtained by the detection voltage obtaining unit.

2. The apparatus of claim 1, wherein the detection voltage outputting unit is a voltage-dividing circuit.

3. The apparatus of claim 2, wherein the detection voltage outputting unit comprises a first resistor and a second resistor, wherein:
   one end of the first resistor is connected to the reference voltage, the other end of the first resistor is connected to one end of the second resistor and the detection voltage obtaining unit, and the other end of the second resistor is grounded.

4. An electronic device, comprising a functional module and the apparatus for identifying the electronic product identifier of claim 3, wherein:
   the apparatus is configured to generate an electronic product identifier for the electronic device; and
   the functional module is configured to implement various functions of the electronic device.

5. An electronic device, comprising a functional module and the apparatus for identifying the electronic product identifier of claim 2, wherein:
   the apparatus is configured to generate an electronic product identifier for the electronic device; and
   the functional module is configured to implement various functions of the electronic device.

6. The apparatus of claim 1, wherein the detection voltage obtaining unit is an analog-digital converting (ADC) module.

7. An electronic device, comprising a functional module and the apparatus for identifying the electronic product identifier of claim 6, wherein:
   the apparatus is configured to generate an electronic product identifier for the electronic device; and
   the functional module is configured to implement various functions of the electronic device.

8. The apparatus of claim 1, wherein the detection voltage obtaining unit is located in a main chip of the electronic product.

9. An electronic device, comprising a functional module and the apparatus for identifying the electronic product identifier of claim 8, wherein:
   the apparatus is configured to generate an electronic product identifier for the electronic device; and
   the functional module is configured to implement various functions of the electronic device.

10. The apparatus of claim 1, wherein the reference voltage is directly provided by a power supply of the electronic product.

11. An electronic device, comprising a functional module and the apparatus for identifying the electronic product identifier of claim 10, wherein:
    the apparatus is configured to generate an electronic product identifier for the electronic device; and
    the functional module is configured to implement various functions of the electronic device.

12. The apparatus of claim 1, wherein the reference voltage is provided by a programmable port of a main chip on the electronic product.

13. An electronic device, comprising a functional module and the apparatus for identifying the electronic product identifier of claim 12, wherein:
   the apparatus is configured to generate an electronic product identifier for the electronic device; and
   the functional module is configured to implement various functions of the electronic device.

14. The apparatus of claim 1, further comprising:
   a product identifier outputting unit, connected to the product identifier obtaining unit and configured to output the obtained product identifier.

15. An electronic device, comprising a functional module and the apparatus for identifying the electronic product identifier of claim 14, wherein:
   the apparatus is configured to generate an electronic product identifier for the electronic device; and
   the functional module is configured to implement various functions of the electronic device.

16. An electronic device, comprising a functional module and the apparatus for identifying the electronic product identifier of claim 1, wherein:
   the apparatus is configured to generate an electronic product identifier for the electronic device; and
   the functional module is configured to implement various functions of the electronic device.

* * * * *